US008022798B2

(12) United States Patent
Damiani et al.

(10) Patent No.: US 8,022,798 B2
(45) Date of Patent: Sep. 20, 2011

(54) COIL WITH SUPERCONDUCTIVE WINDINGS COOLED WITHOUT CRYOGENIC FLUIDS

(75) Inventors: Daniele Damiani, Genoa (IT); Adamo Laurenti, Rapallo (IT); Roberto Marabotto, Genoa (IT); Mauro Perrella Segre, Genoa (IT)

(73) Assignee: ASG Superconductors S.p.A, Genoa (IT)

( * ) Notice: Subject to any disclaimer, the term of this patent is extended or adjusted under 35 U.S.C. 154(b) by 277 days.

(21) Appl. No.: 12/342,773

(22) Filed: Dec. 23, 2008

(65) Prior Publication Data

US 2009/0315655 A1  Dec. 24, 2009

(30) Foreign Application Priority Data

Dec. 27, 2007 (IT) .............................. TO2007A0940

(51) Int. Cl.
*H01F 6/00* (2006.01)
(52) U.S. Cl. ......... 335/216; 335/299; 505/163; 505/892
(58) Field of Classification Search .................. 335/216, 335/296–299; 324/318–322; 505/163, 888, 505/892
See application file for complete search history.

(56) References Cited

U.S. PATENT DOCUMENTS

| | | | |
|---|---|---|---|
| 3,416,111 A | 12/1968 | Gunther | |
| 4,933,657 A * | 6/1990 | Bessho et al. | 335/299 |
| 4,985,678 A | 1/1991 | Gangarosa et al. | |
| 5,083,105 A * | 1/1992 | Herd et al. | 335/216 |
| 5,138,326 A * | 8/1992 | Edwards et al. | 324/319 |
| 5,659,277 A * | 8/1997 | Joshi et al. | 335/216 |
| 5,912,607 A * | 6/1999 | Kalsi et al. | 335/216 |
| 6,081,179 A * | 6/2000 | Kato | 335/299 |
| 6,693,504 B1 * | 2/2004 | Snitchler et al. | 335/216 |
| 2007/0257754 A1 | 11/2007 | Gilgrass | |

FOREIGN PATENT DOCUMENTS

| | | |
|---|---|---|
| EP | 0 452 046 A2 | 10/1991 |
| EP | 0 877 395 A1 | 11/1998 |
| WO | WO 01/06524 A2 | 1/2001 |
| WO | WO 2006/011170 A1 | 2/2006 |

OTHER PUBLICATIONS

European Search Report dated Aug. 8, 2000.

* cited by examiner

*Primary Examiner* — Anh T Mai
*Assistant Examiner* — Bernard Rojas
(74) *Attorney, Agent, or Firm* — Venable LLP; Robert S. Babayi; Leigh D. Thelen (57) ABSTRACT

A coil comprises a set of windings with a generally annular shape and formed by a plurality of series-connected partial windings made of a superconductor with a high critical temperature, in which these partial windings are arranged next to each other in stratified form, and at least one cooling sheet which is made of thermally conductive material and arranged in contact with this set of windings and which is designed to be connected in a thermally conductive manner to a cryogenic cooling system.

13 Claims, 13 Drawing Sheets

COIL WITH SUPERCONDUCTIVE WINDINGS COOLED WITHOUT CRYOGENIC FLUIDS

CROSS-REFERENCE TO RELATED APPLICATION

This application claims the priority of Italian Patent Application No: TO2007A000940, filed on Dec. 27, 2007, the subject matter of which is incorporated herein by reference in its entirety.

BACKGROUND OF THE INVENTION

The present invention relates generally to superconductive coils.

As is known, these devices require for operation a cooling system in order to keep the superconductor from which the coil is made below its critical temperature.

Conventional cooling systems use fluids which change their state, such as liquid helium, in order to reach and maintain the low temperatures needed to ensure the superconductive behaviour of the coil material. This gives rise to certain safety problems associated with the overpressures which are generated in the cryostat in the so-called "quench" condition (namely the transition from superconductor to normal conductor) together with costly maintenance due to the need to replenish the evaporating fluid.

One object of the invention is therefore to provide a coil which is able to overcome the problems associated with the use of state-changing fluids for cooling the superconductor.

This object is achieved by means of a coil as defined in the claims which follow.

SUMMARY OF THE INVENTION

The invention therefore relates to a coil comprising a set of windings with a generally annular shape and formed by a plurality of series-connected partial windings made of a superconductor with a high critical temperature, in which said partial windings are arranged next to each other in stratified form, and at least one cooling sheet which is made of thermally conductive material and arranged in contact with said set of windings and is able to be connected in a thermally conductive manner to a cryogenic cooling system.

The invention also relates to a magnetic resonance imaging apparatus comprising a pair of coils according to the invention.

BRIEF DESCRIPTION OF THE DRAWINGS

Further characteristic features and advantages of the invention will emerge from the detailed description which follows, provided with reference to the accompanying drawings in which:

FIG. 3b is a cross-sectional view of the support structure and the set of windings according to FIG. 3a;

FIGS. 3c and 3d are views, on a larger scale, of details shown in FIG. 3b;

FIGS. 7a to 7f are views which show the windings according to FIG. 3a;

DETAILED DESCRIPTION OF THE EMBODIMENT

Figure 1:
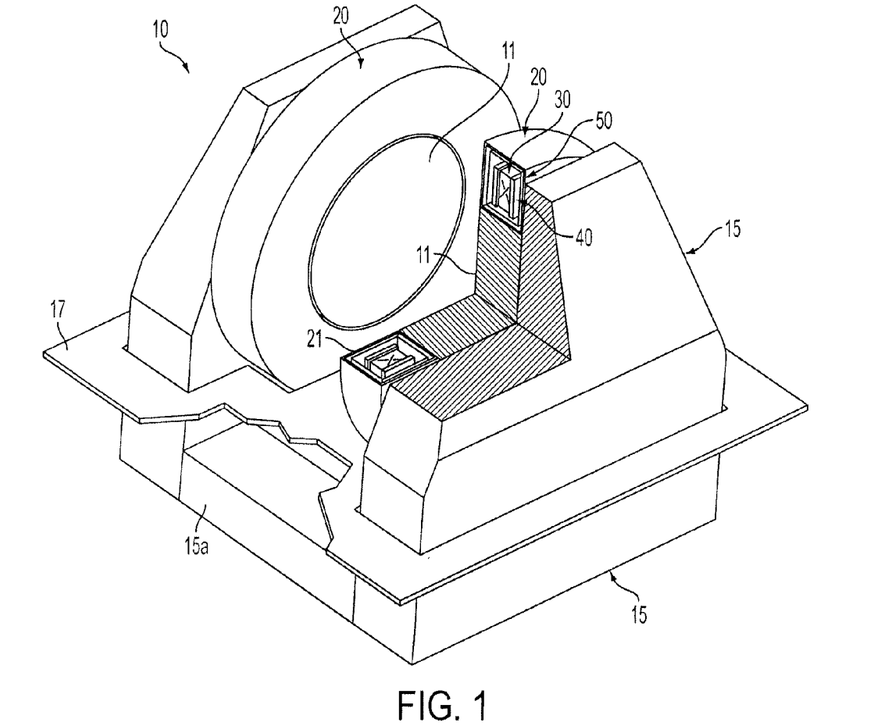
FIG. 1 is a perspective view which shows a magnet of a magnetic resonance imaging apparatus comprising a pair of coils according to the invention.
Figure 2A:
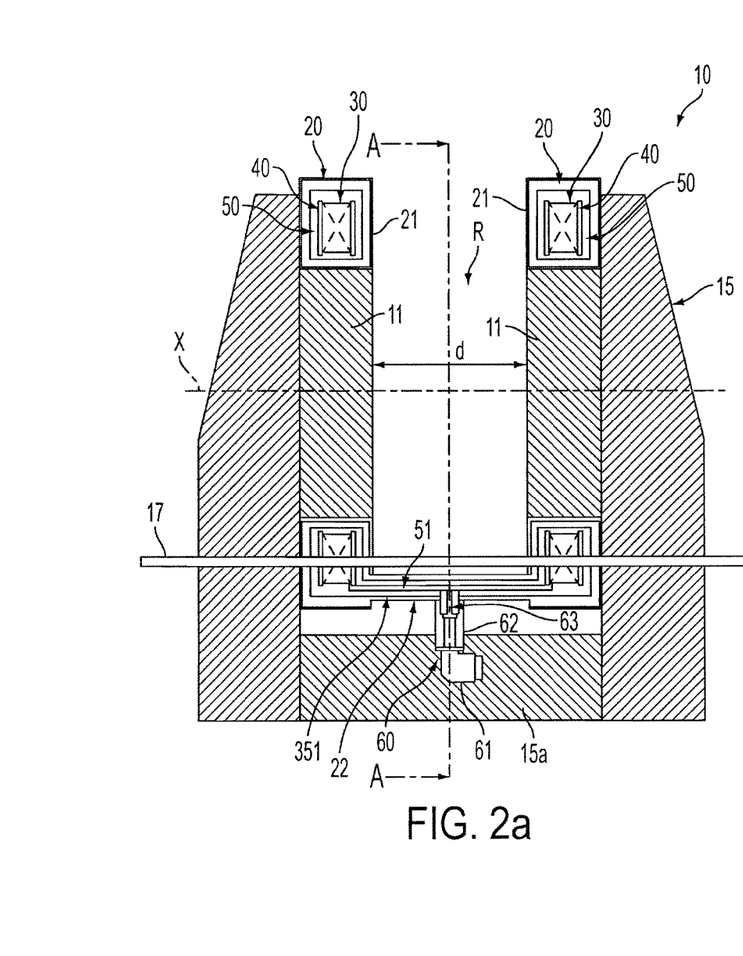
FIGS. 2a and 2b are cross-sectional views of the magnet according to FIG. 1.
Figure 2B:
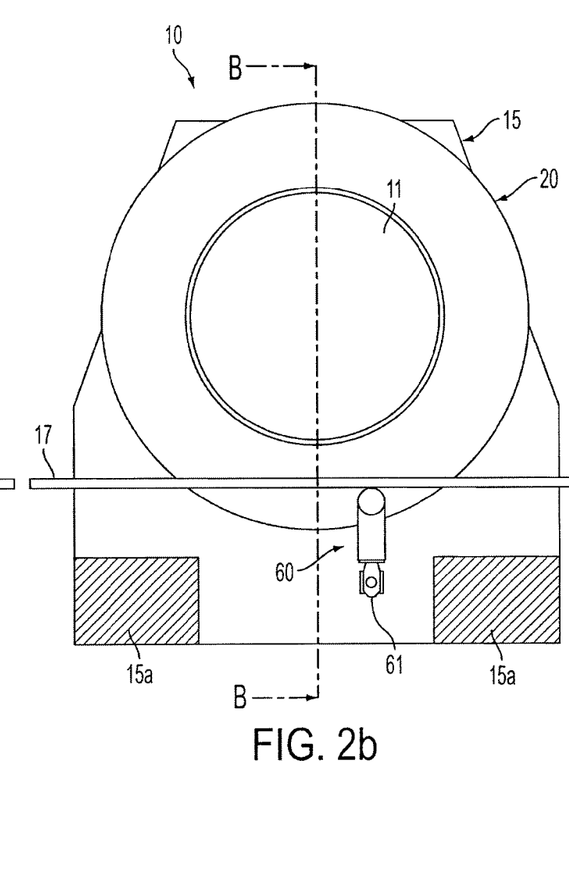

With reference to FIGS. 1, 2a and 2b, these show, by way of example, a magnet, denoted overall by 10, of a magnetic resonance imaging apparatus of the open-roof type. Although the application of the invention to such an apparatus is particularly advantageous, in reality the invention is not limited to this since it may be used for the construction of electrical machines in general such as, for example, transformers, motors, generators, current limiters, power accumulation systems, multi-polar magnets, etc.

The magnet 10 comprises a U-shaped yoke which is made from ferromagnetic material, denoted overall by 15, and which connects together a pair of pole faces 11 situated at a distance from each other along a polar axis x. The magnet 10 is arranged vertically so that the polar axis is arranged horizontally and above the central part 15a of the yoke. The pole faces 11 define between them a receiving zone R for a patient.

A false floor 17 is arranged at a level higher than the central part 15a of the yoke so as to allow access to the receiving zone, said access occurring by means of positioning means (not shown) designed to position and pick up the patient inside and from the receiving zone R.

The magnet also comprises two coils 20 which are each arranged concentrically around each of the pole faces 11, respectively. These coils can be conventionally controlled by a control unit (not shown) so as to generate a magnetic flux inside the receiving zone R.

Each coil 20 comprises a vacuum chamber 21 formed in the manner of a casing with a substantially annular shape and rectangular box-like cross-section. The vacuum chambers 21 are secured to the magnetic yoke 15 by means of non-magnetic supports (not shown).

The vacuum chambers 21 are connected together by a connection duct 22 which is in turn connected to a vacuum system (not shown) of the conventional type.

Each vacuum chamber houses internally a respective set of windings 30 with a generally annular shape extending both axially and circumferentially inside the vacuum chamber 21. Each set of windings is enclosed inside a respective support structure 40 which is in turn secured to a wall (see FIGS. 3a-3d) of the vacuum chamber 21. A heat screen 50 arranged around each set of windings 30 may also be envisaged (visible in FIGS. 1 and 2a), said screen being formed as a substantially annular-shaped casing with a rectangular box-like cross-section and also being secured to the wall of the vacuum chamber 21 by means of supports with a high thermal conductivity (not shown). The two heat screens 50 respectively arranged around the two sets of windings 30 are connected together in a thermally conductive manner by a tubular connecting section 51 extending inside the connection duct 22 of the vacuum chambers 21.

With reference to FIGS. 2*a* and 2*b*, the apparatus also comprises a cryogenic cooling system 60. This system comprises at least one cryocooler 61 with two refrigeration stages 62 and 63, the first refrigeration stage 62 of which is connected in a thermally conductive manner to the tubular connecting section 51 of the heat screens 50. In this way, the cryocooler 61 is able to cool the heat screens 50 to a temperature in the range of 40 to 150 K so as to minimise the heat dispersion to the outside. The cryocooler 61 is secured to the wall of the connection duct 22 of the vacuum chambers 21. The position of the cryocooler 61 is optimised so as to function in the most efficient manner possible and minimise the problems associated with space, vibration and noisiness. As an alternative to the single cryocooler a respective cryocooler for each coil 20 may be used.

Figure 6:
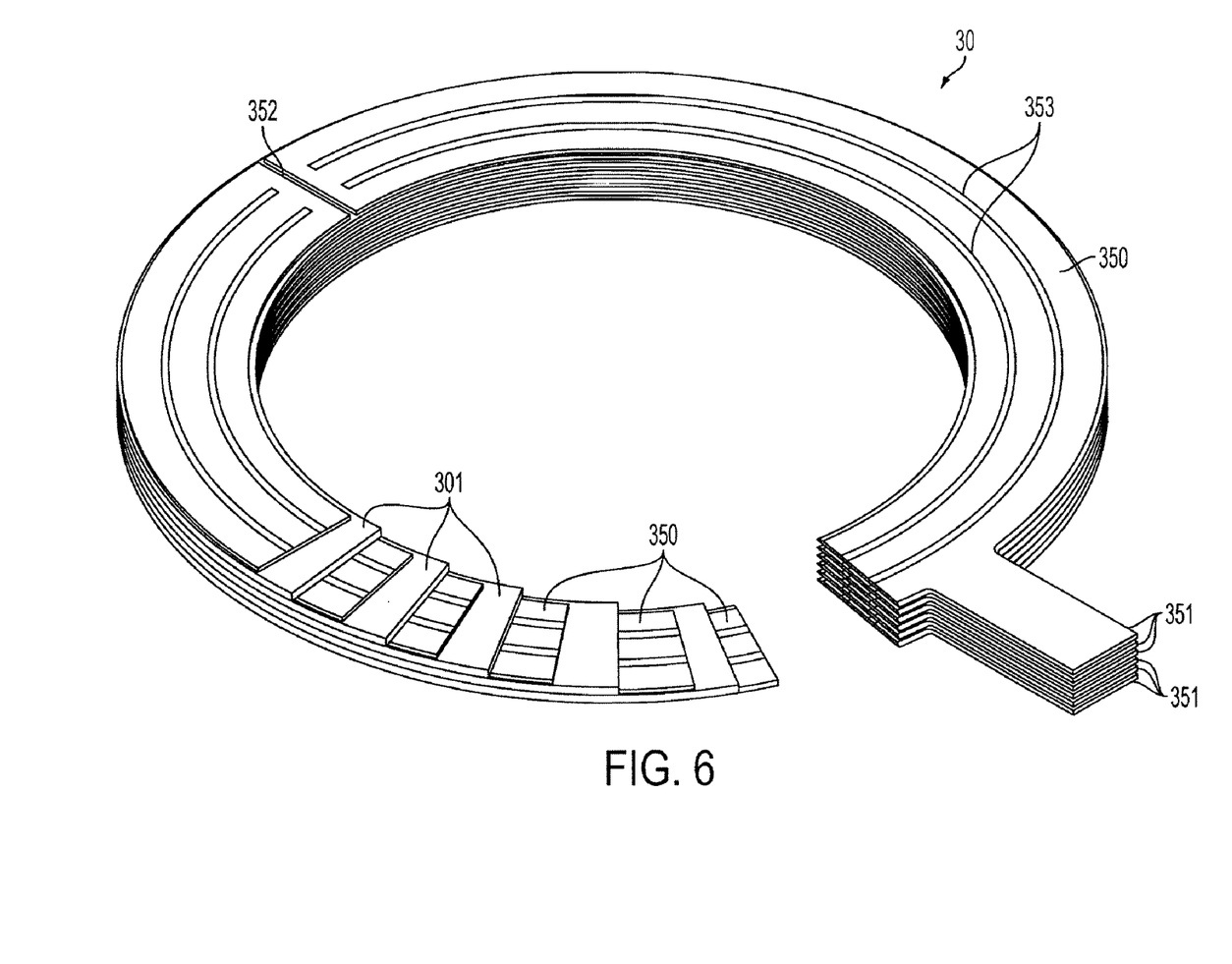
FIG. 6 is a cutaway view of the set of windings according to FIG. 3a without the support structure.
Figure 7A:
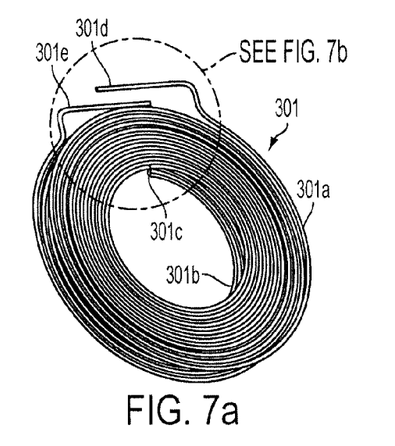
Figure 7B:
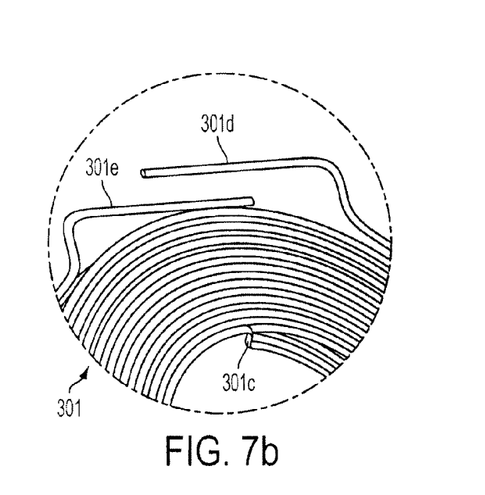
Figure 7C:
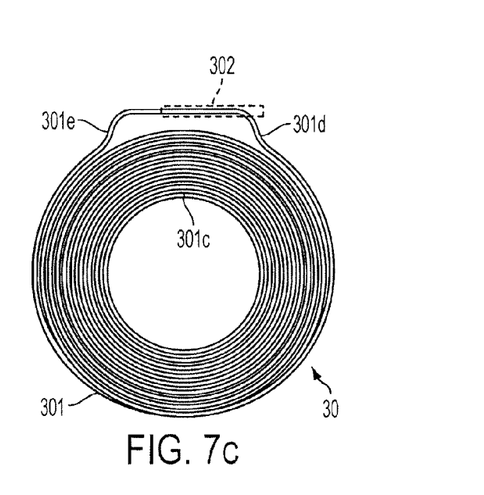
Figure 7D:
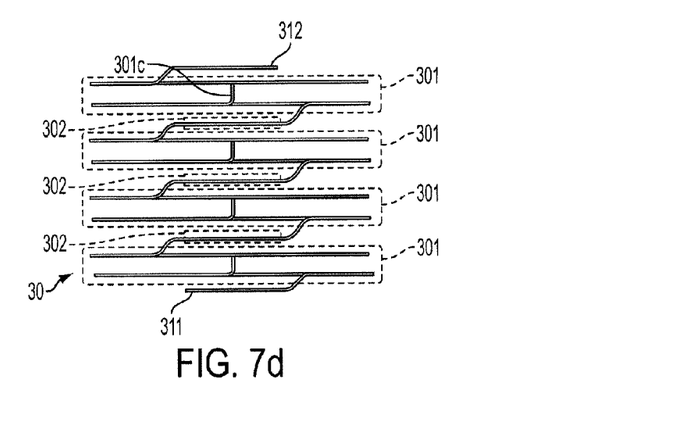
Figure 7E:
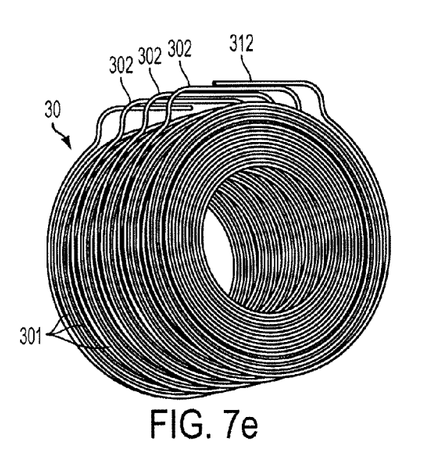
Figure 7F:
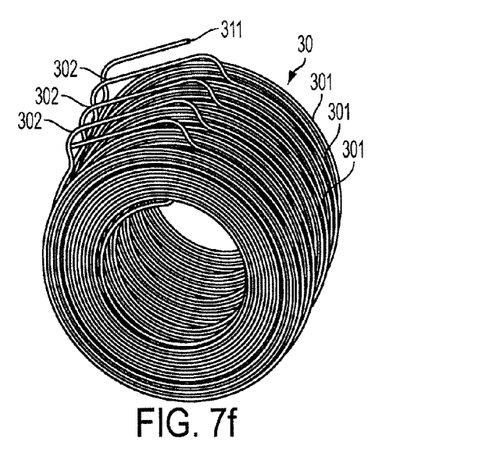

With reference in particular to FIGS. 6 and 7*a*-7*f*, each set of windings 30 is formed by a plurality of series-connected partial superconductor windings 301, which are arranged next to each other in stratified form. FIGS. 7*a* and 7*b* show a single partial winding 301, while FIGS. 7*c*-7*f* show the set of windings 30 formed by a plurality of partial windings 301.

The superconductor used for the windings is preferably, but not exclusively, a multi-filament strap made of $MgB_2$, in accordance with international application WO 2006/011170 A1. The type and/or the geometrical form of the superconductor may, however, be different since other superconductive materials with a high critical temperature (HTS), such as BSCCO or YBCO for example, may be used and the cross-section may be circular for example. The electrical insulation between the turns and earth of the coils consists for example of a glass fabric impregnated with a thermosetting resin. Possible variants envisage insulation of the superconductor with tape or glass braiding or any other material compatible with the thermosetting resin used for final impregnation of the winding.

The geometrical winding form of the superconductor is preferably designed so as to allow winding of the superconductor using the so-called "React and Wind" technique. Therefore, winding is performed using wide radii so as to be compatible with a superconductor which has already reacted and is therefore fragile and prone to degradation should the folding radii be less than a certain limit value. This winding technique offers advantages compared to the so-called "Wind and React" technique since it does not require special measures for the electrical insulation which must withstand at the most the temperature envisaged for polymerisation of the resin and not the reaction temperature of the superconductor.

FIGS. 7*a*-7*d* show windings of the type known as double-pancake windings. As can be seen in FIGS. 7*a* and 7*b*, in each partial double-pancake winding 301 the turns are arranged so as to form substantially two layers 301*a* and 301*b* which are connected together by means of a transition section 301*c*. For the sake of clarity of illustration, these layers are shown separate in the figures; in reality, they lie in contact with each other. In each partial winding 301 the superconductor is monolithic, namely does not have internal joints, and has two opposite outer connecting ends 301*d* and 301*e* respectively associated with the layers 301*a* and 301*b* so as to allow connection to other partial windings 301, as illustrated in FIGS. 7*c*-7*f*.

The electrical joints 302 between each partial winding 301 and the next adjacent winding may be of the resistive type, with resistance values for example of about $10^{-8}$ Ohm, or of the superconductive type, with values for example of about $10^{-12}$ Ohm; in this latter case the system allows operation in persistent mode (namely with the power supplier excluded).

The electrical supplying of power to the sets of superconductive windings 30 is performed using electrical feedthroughs which are optimised for low cryogenic consumption and which are connected on the one hand to the terminals 311, 312 of each set of windings and, on the other hand, to an external power supplier via the vacuum chamber.

Figure 9:
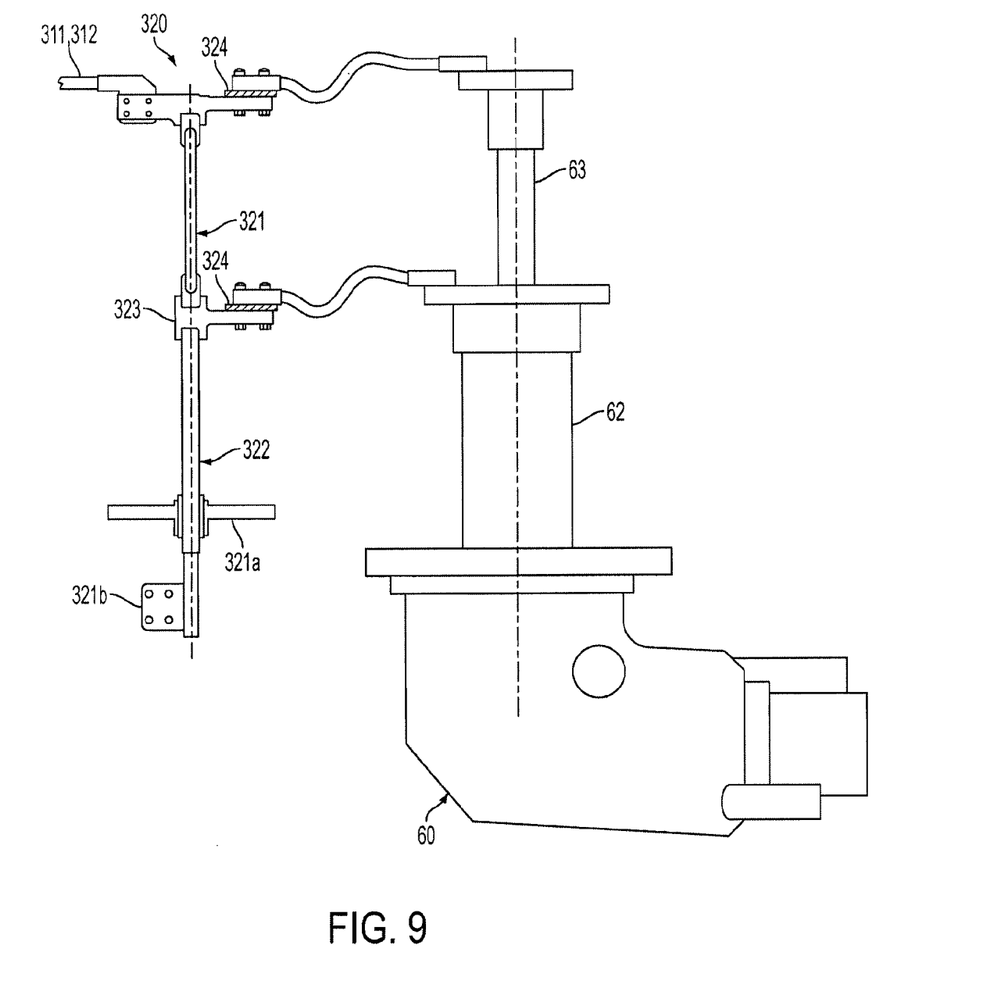
FIG. 9 is a schematic view of an electric feedthrough for supplying power to the set of windings, with corresponding thermal connections.

FIG. 9 shows one of the abovementioned feedthroughs denoted overall by 320. These feedthroughs have dimensions such as to convey the current necessary for the winding and are divided into two parts 321, 322 so as to minimise the effects of the thermal gradient.

The feedthrough according to FIG. 9 therefore comprises a first part 321 which is connected directly to one of the terminals 311, 312 of the winding and which is made with an HTS (for example YBCO or BSCCO) and cooled via the second refrigeration stage 63 of the cryorefrigerator; and a second part 322 which is connected to the first part and partially projects from the vacuum chamber 21 and which is made of resistive material (typically copper and/or brass) and has dimensions such as to minimise both the thermal power generated by the Joule effect during the passage of current and the heat conduction to the exterior.

The second part 321 of the feedthrough 320 is designed to be secured to the wall of the vacuum chamber 21 by means of a mounting flange 321*a* and outside the chamber is connected to an electrical connection 321*b* for connection to the external power supplier. An insulation 321*c*, which ensures the electrical insulation and perfect vacuum sealing of the chamber 21, is arranged between the second part 321 and the flange 321*a*.

The zone 323 for connection of the two parts 321, 322 of the feedthrough is in turn cooled to an intermediate temperature of between 50 and 130 K via the first refrigeration stage 62 of the cryocooler.

The thermal connection to the two stages of the cryocooler is performed by the arrangement, in between, of a special insulation 324 with a thickness equal to or greater than 0.02 mm, made of a material suitable for ensuring at the same time high thermal conductivity and low electrical conductivity and consisting, for example, of epoxy resin (such as Stycast®) reinforced with thermally conductive material, or aluminium oxides ($Al_2O_3$) and/or aluminium nitrides (ALN).

The sets of superconductive windings 30 are cooled by means of thermal conduction to a predetermined operating temperature >10 K by means of use of the cryocooler 61. For this purpose, as shown in particular in FIG. 6, a flat cooling sheet 350 made of thermally conductive material, in contact with these partial windings and electrically insulated from them, is arranged between each partial winding 301 and the next adjacent winding. Each coil 20 therefore comprises a plurality of these cooling sheets 350 which are connected in parallel and in a thermally conductive manner to the second refrigeration stage 63 of the cryocooler 61. The material of the sheets 350 must consist of a material with a high thermal conductivity, for example copper.

Figure 8:
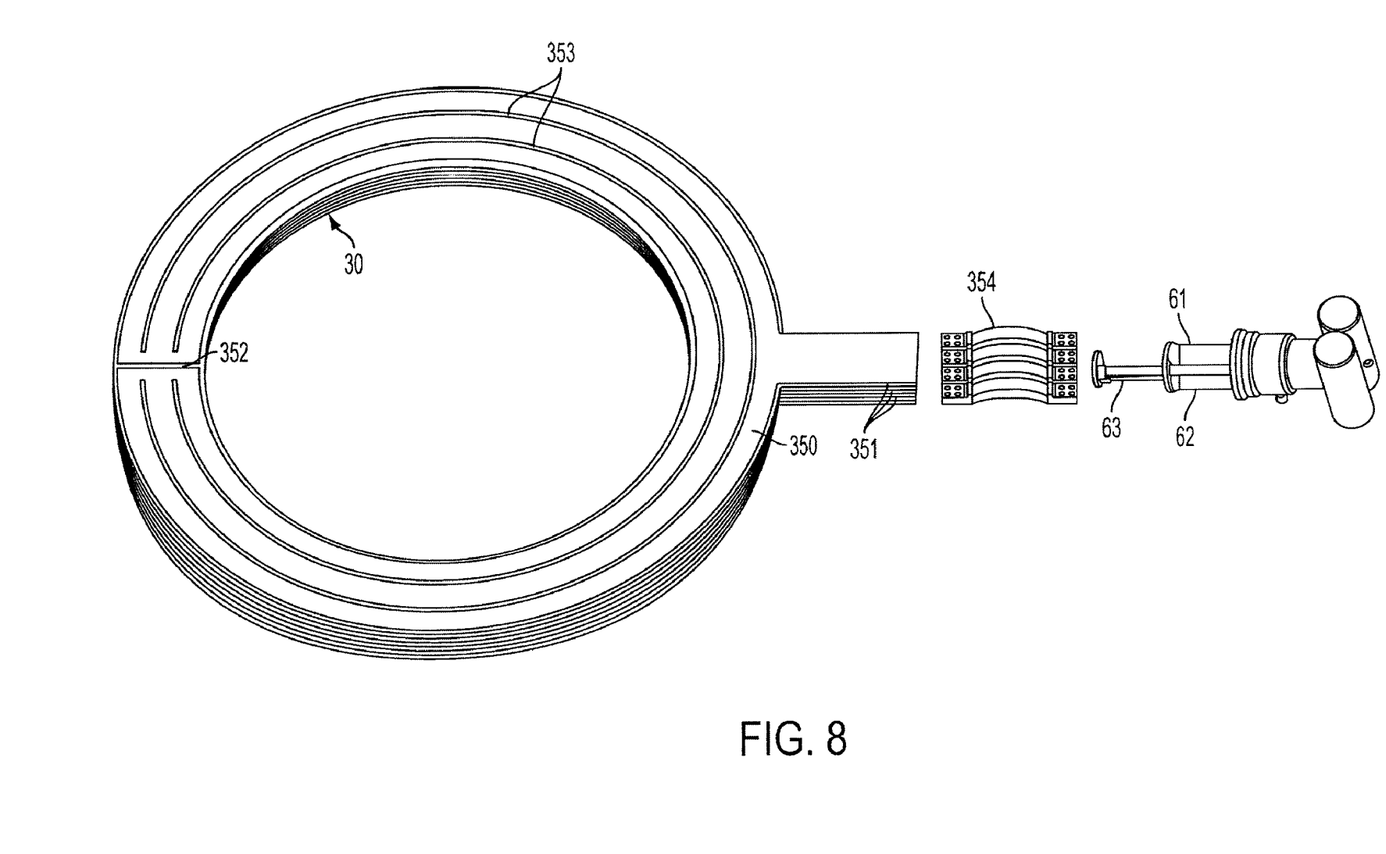
FIG. 8 is a view which shows the connection of the set of windings to a cryogenic cooling system.

In particular, the two sets of sheet 350 are connected together and to the cryocooler 61 by means of a thermally conductive connection element 351, extending inside the tubular section 51 which connects the heat screens 50, and by means of an anti-vibration system 354 (shown in FIG. 8) for favouring damping of the vibrations transmitted to the coils 30.

As shown in FIG. 6, the cooling sheets 350 have a substantially annular shape corresponding to the annular shape of the partial windings 301 and have respective projecting portions 351 which protrude laterally from the body of the coil so as to allow their thermal connection to the cooling system 60. Each sheet 350 also has radial notches 352 and circumferential notches 353 which are able to reduce the losses associated with eddy currents induced during operation of the apparatus.

With reference in particular to FIGS. 3*a*-3*d*, the support structure 40 encloses in sandwich form the partial windings 301 and the cooling sheets 350 of each coil 30 so as to keep them mechanically in contact with each other. For this purpose, the support structure 40 comprises two end plates 401 and 402 which have an annular shape and are arranged on opposite sides of the coil 30. These end plates 401, 402 are fastened together by means of tie-rods 403 arranged at regular intervals along the internal circumference and/or external circumference of the end plates 401, 402. Securing of the support structure 40 to the wall of the vacuum chamber 21 is performed by means of a plurality of articulated supports 410 arranged along the external circumference of the end plate 401.

Figure 5:
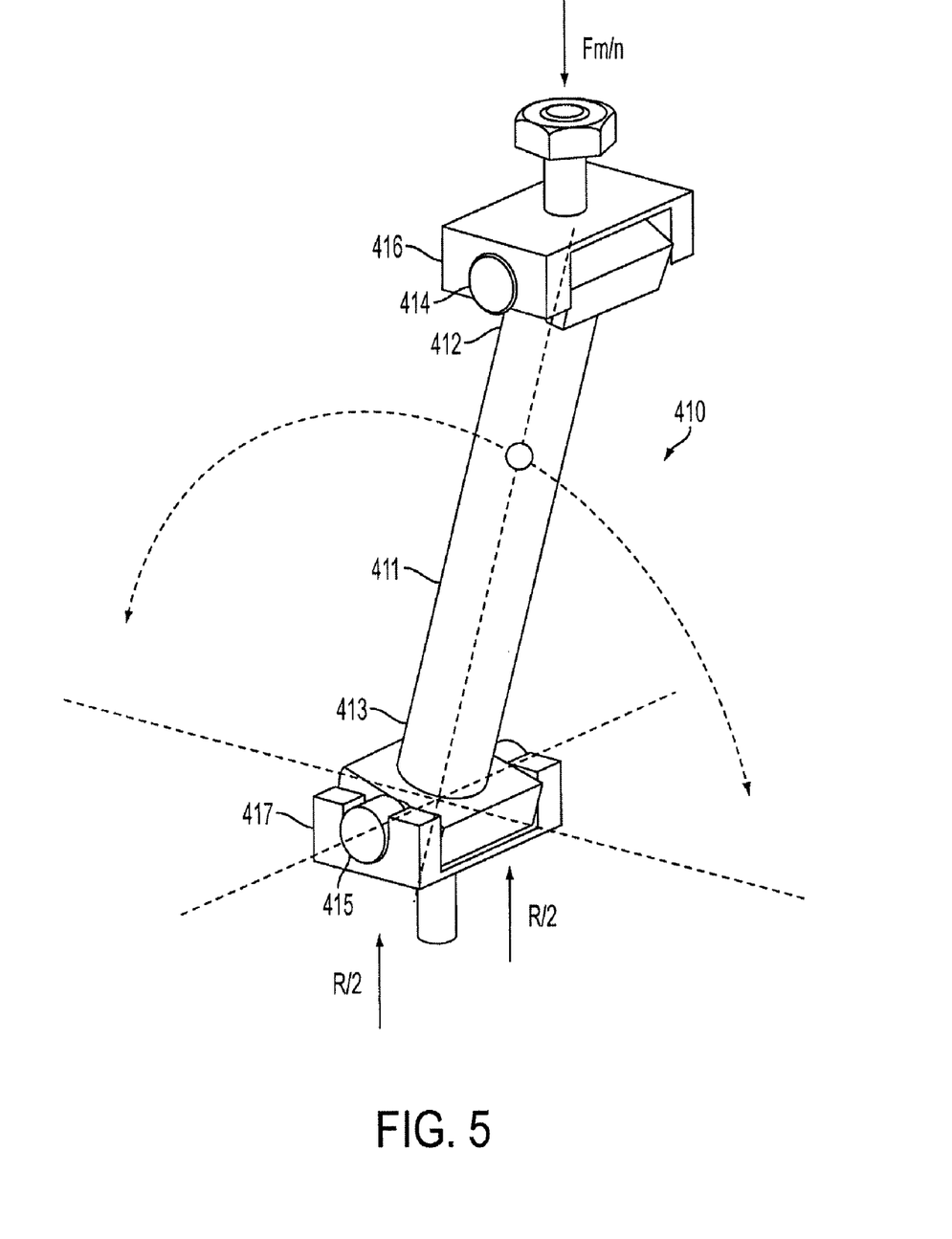
FIG. 5 is a view which shows the forces acting on the winding supports during operation.

With reference also to FIG. 5, each articulated support 410 comprises a hollow strut 411 which is made of material with a high mechanical strength and low thermal conductivity, for example stainless steel, titanium, carbon fibre or glass fibre, and the ends 412, 413 of which are hinged with the end plate 401 of the support structure 40 of the coil 30 and the wall of the vacuum chamber 21, respectively. Therefore, a respective pin 414, 415, the axis of which is tangential to the circumferential direction, is associated with each end 412, 413 of the strut 411, and each pin 414, 415 is housed rotatably inside a respective seat 416, 417 which is fastened to the end plate 401 of the support structure 40 of the coil 30 and to the wall of the vacuum chamber 21, respectively. In this way, each articulated support 410 has freedom of rotation in a respective radial plane.

Figure 3A:
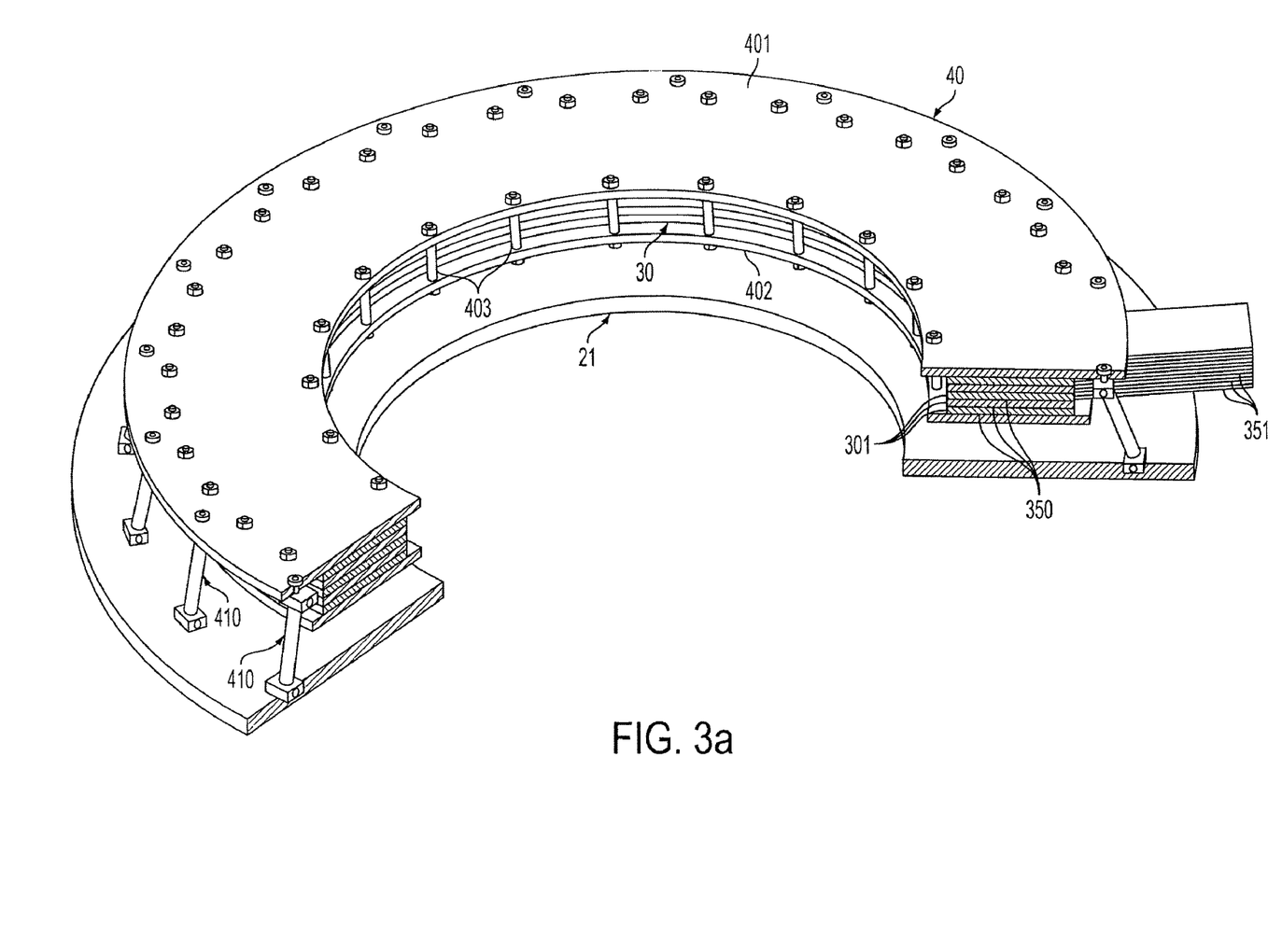
FIG. 3a is a cutaway view of a support structure and a set of windings of a coil of the magnet according to FIG. 1.
Figures 3B, 3C, 3D:
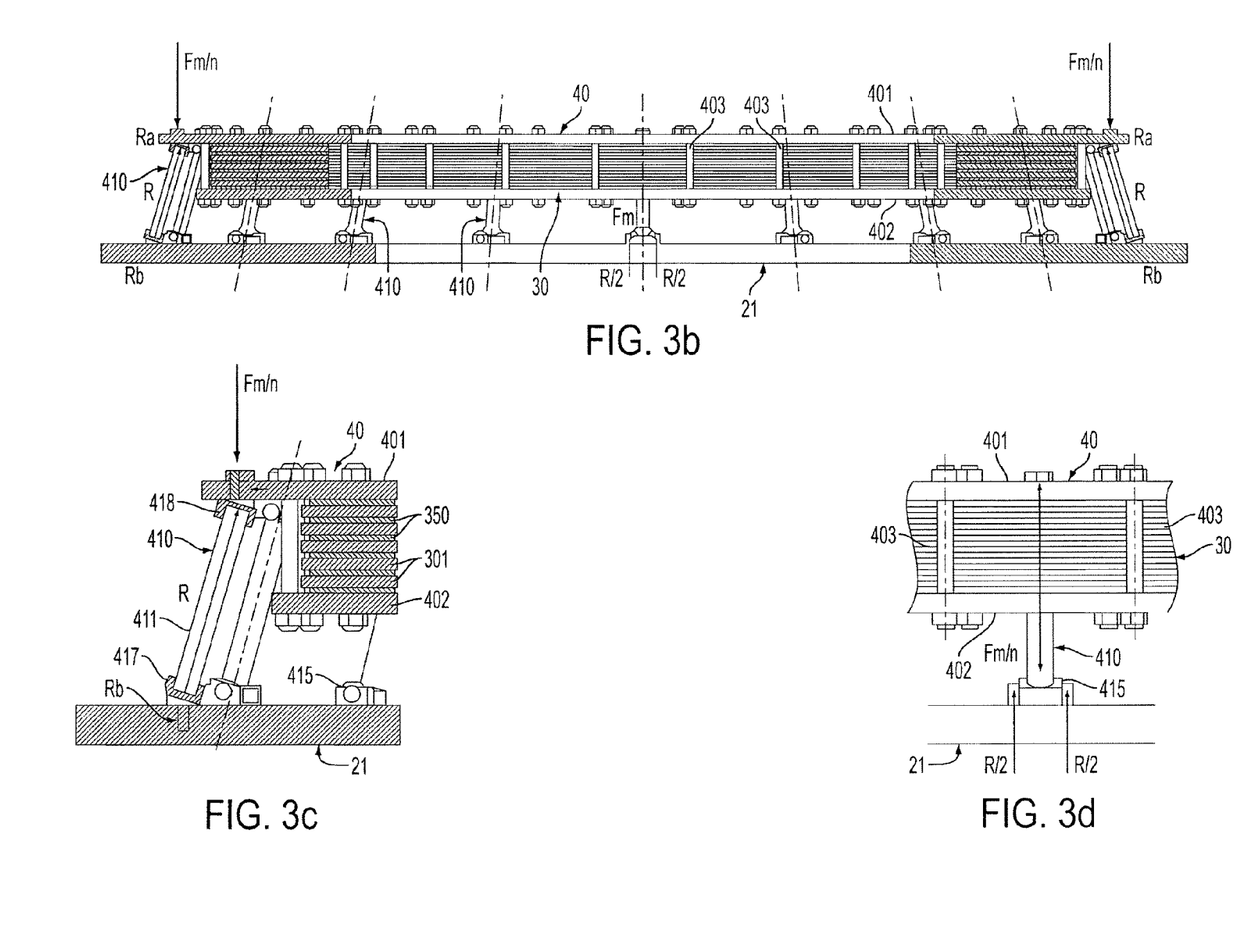
Figure 4:
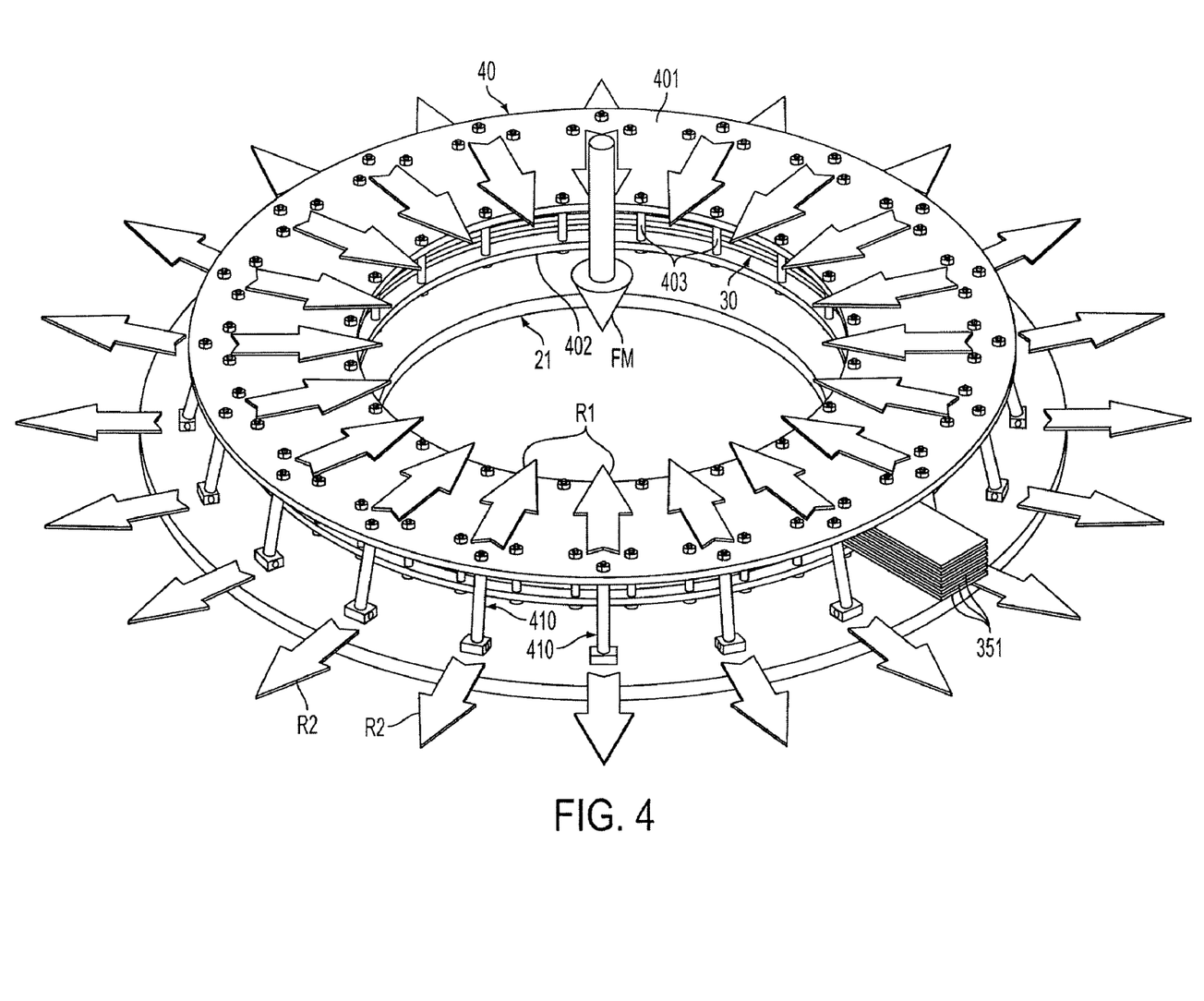
FIG. 4 is a view which shows the forces acting on the support structure during cooling/heating/operation of the coil.

Owing to this configuration, as shown in FIG. 4, the magnetic force FM produced by the coil 20 during operation, namely the forces due to the differential thermal expansion which occurs during the stages of cooling/heating between winding 30 and vacuum chamber 21, produce reactions R1 and R2 which are spread over the articulated supports 410 and the structures which are connected by them and are directed radially and tend to centre, compact and rigidify the overall system, making it more insensitive to the lateral forces. FIGS. 3*b* and FIGS. 3*c* and 3*d*, which show on a larger scale details of FIG. 3*b*, also show the forces which act on each articulated support 410. Fm/n indicates the overall force which acts on one of the n articulated supports, R the reaction force in the direction of extension of the strut 411, Ra and Rb the reaction forces in the radial direction at the ends of the articulated support 410, and R/2 the reaction forces in a direction perpendicular to the walls of the vacuum chamber 21 acting on the sides of the hinging pin 415.

Each coil 20 may envisage a conventional active screening system (not shown) for minimising the influence of the magnetic field in the external environment so as to comply with the compulsory regulations. This system consists essentially of an additional winding such as to produce a field opposite to that of the dispersed flux which must be eliminated.

Figure 10:
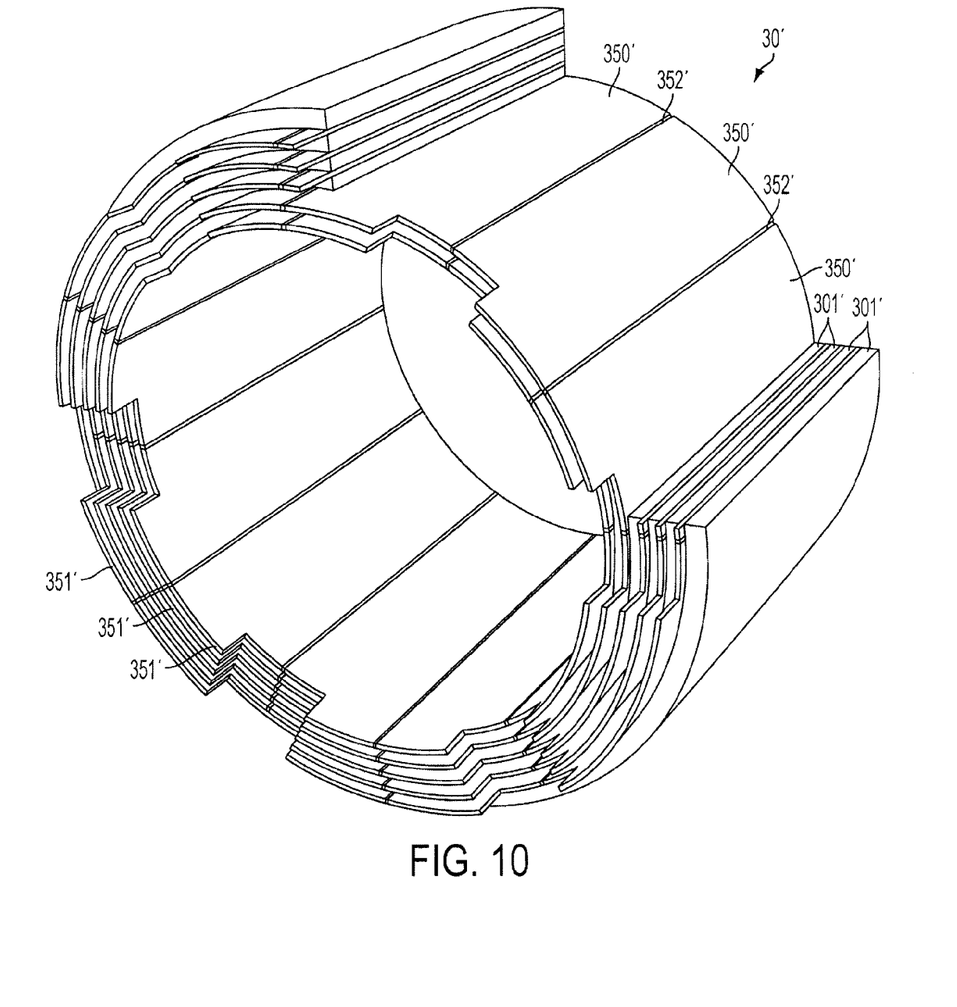
FIGS. 10 and 11 are cutaway views of alternative embodiments of a set of windings in a solenoid configuration according to the invention.

FIG. 10 shows an alternative embodiment of the set of superconductive windings, denoted overall by 30'. This set of 30' also has a generally annular shape and is formed by a plurality of series-connected partial superconductor windings 301' which are arranged next to each other in stratified form.

In order to produce these windings the same types of superconductor and insulant mentioned with reference to the previous embodiment are used.

Differently from the previous embodiment, the partial windings 301' are provided in the manner of a solenoid, thus forming concentric layers.

A plurality of curved cooling sheets 350' which are made of thermally conductive material and make contact with these partial windings are arranged between a series of partial windings 301' and the next adjacent series, said sheets being designed to be connected in parallel and in a thermally conductive manner to the second refrigeration stage 63 of the cryocooler 61. The material of the sheets 350' must have a high thermal conductivity, for example copper or aluminium. These cooling sheets 350' are arranged alongside each other so as to form overall an annular collar corresponding to the shape of the partial windings 301' All the sheets 350' therefore form a series of concentric annular collars throughout the coil 30'.

Each sheet 350' has a respective projecting portion 351' which projects axially from the body of the coil so as to allow thermal connection thereof to the cooling system 60. The sheets 350' of each annular collar have between them axial interstices 352' designed to reduce the losses associated with the eddy currents induced during operation of the apparatus.

A support structure (not shown) is envisaged for the assembly 30' and encloses in sandwich form the partial windings 301' and the cooling sheets 350' so as to keep them mechanically in contact with each other.

Figure 11:
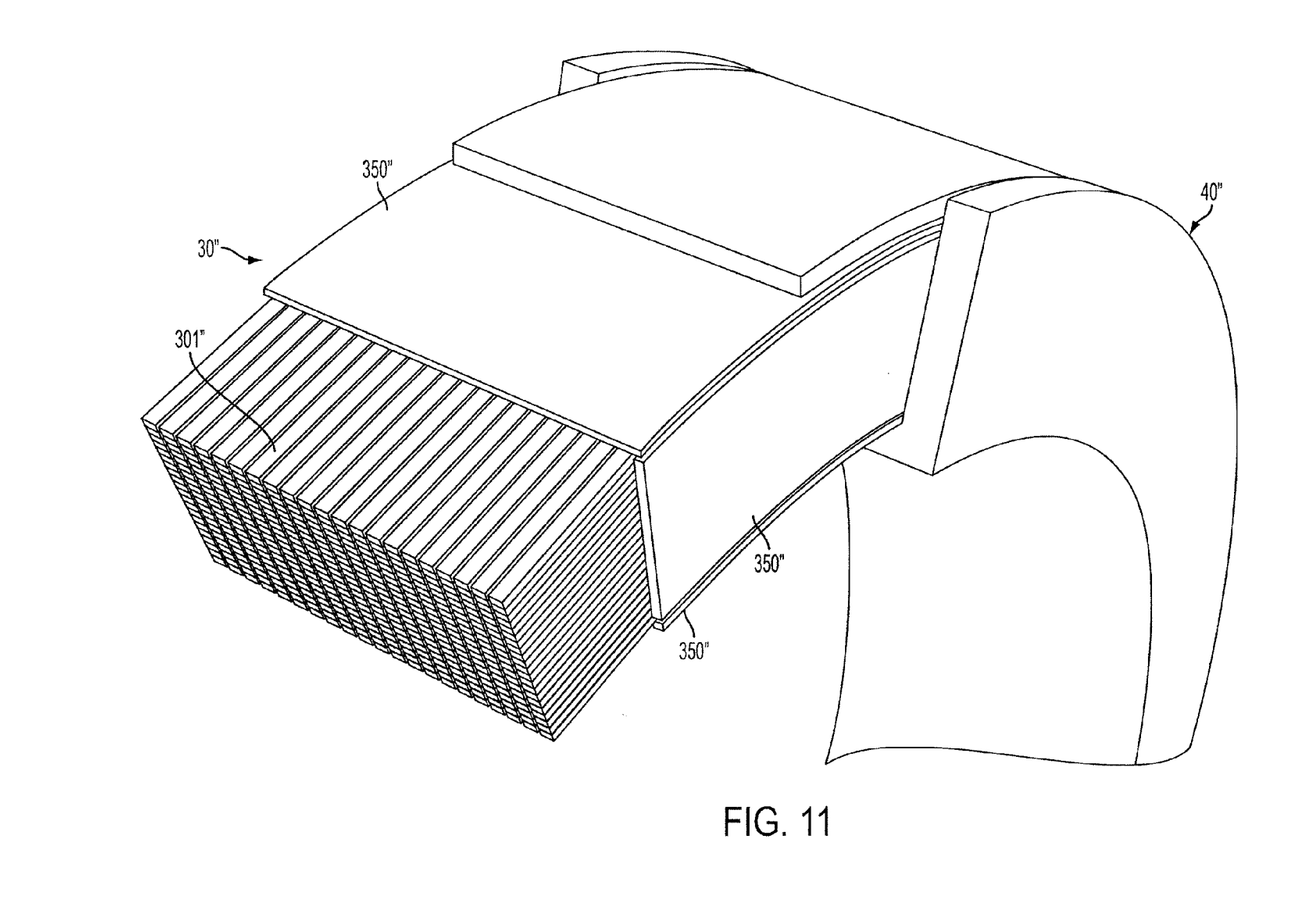

A further embodiment is shown in FIG. 11. According to this embodiment, the set of windings 301", which are denoted overall by 30", may be formed both with a solenoid-like and with a double-pancake configuration. However, the cooling sheets 350" are arranged only on the four outer surfaces of the set of windings (radially inner surface, radially outer surface and the two side surfaces) or (according to an alternative solution not shown) only on one or more of them. In this case, it is possible to envisage a support structure 40" operationally distinct from the cooling plates, or the latter may also perform a structural support function.

A superconductive system conceived according to the invention provides magnetic fields of a certain magnitude (from 0.5 to 7 T), with considerable advantages when compared with superconductive resistive systems with a low critical temperature or of the permanent magnet type, in terms of costs, performance, reduced weight and volume, reliability, ease of use and low energy consumption.

The absence of cryogenic fluid, for example liquid helium, results in ease of installation, reduced weight and dimensions, and less complex cooling systems. This advantage means that the system may be used in countries where a supply of helium is not easily available.

Moreover, there is no need to replenish the cryogenic fluid which evaporates, with a consequent saving in costs and easy maintenance.

Another aspect of fundamental importance is the operating safety; in fact the cryogen-free system does not give rise to any problems associated with the overpressures which are produced inside the vacuum chamber owing to the increase in temperature during transition of the superconductor into the resistive state in conventional systems.

With the cryogen-free system it is possible, moreover, to provide a system of coils and cryostat arranged in a vertical position (as in the case of the magnetic resonance imaging magnet described above), something which would instead be much more complex to achieve with liquid helium. Moreover, with reference to application in a magnetic resonance imaging apparatus, it is possible to obtain a receiving space for the patient which has a width d greater than 550 mm.

High-temperature superconductors (HTS) are moreover much more stable than superconductors with a low critical temperature so that the accidental transition into the resistive state, in addition to not being intrinsically dangerous for the safety of persons, is also much less likely, this being a guarantee of more regular operation resulting in a saving in the amount of time needed for cooling the system after quenching.

It is understood that the characteristic features which have been described with reference only to some specific variants may be combined, provided that they are compatible, with the characteristic features of the other variants described or with other variants which may occur to a person skilled in the art, without thereby departing from the scope of the present invention.

What is claimed is:

1. A coil, comprising;
   a set of windings with a generally annular shape and formed by a plurality of series-connected partial windings made of a superconductor with a high critical temperature, in which said partial windings are arranged next to each other in stratified form,
   at least one cooling sheet which is made of thermally conductive material and arranged in contact with said set of windings and which is designed to be connected in a thermally conductive manner to a cryogenic cooling system,
   a support structure having a pair of end plates arranged on opposite sides of the coil, able to enclose in sandwich form said partial windings and said at least one cooling sheet so as to keep them mechanically in contact with each other, and
   a vacuum chamber which contains said set of windings and support structure, said support structure being secured to a wall of the vacuum chamber via a plurality of articulated supports arranged along the external circumference of the end plate furthest from the wall of the vacuum chamber, whose ends are hinged with the end plate of the support structure of the coil and the wall of the vacuum chamber, respectively, each articulated support having a freedom of rotation in a respective radial plane with respect to the coil.

2. The coil according to claim 1, in which said partial windings are formed in the manner of a double pancake and said at least one cooling sheet is arranged on at least one external surface of the set of windings.

3. The coil according to claim 1, in which at least one cooling sheet made of thermally conductive material is arranged between different layers of partial windings in contact therewith, said coil comprising therefore a plurality of these cooling sheets, which are able to be connected in parallel and in a thermally conductive manner to the cryogenic cooling system.

4. The coil according to claim 3, in which said partial windings are formed in the manner of a solenoid and in which a plurality of curved cooling sheets is arranged between each series of partial windings and the next adjacent series, said sheets being arranged alongside each other so as to form overall an annular collar, each sheet having a respective projecting portion which projects axially from the coil so as to allow thermal connection thereof to the cryogenic cooling system.

5. The coil according to claim 4, in which the sheets of the annular collar have between them axial interstices designed to reduce the losses associated with the eddy currents induced.

6. The coil according to claim 3, in which said partial windings are formed in the manner of a double pancake and in which a flat cooling sheet is arranged between each partial winding and the next adjacent one, said cooling sheet having a substantially annular shape and having a respective projecting portion which projects laterally from the coil so as to allow the thermal connection thereof to the cryogenic cooling system.

7. The coil according to claim 6, in which said cooling sheet has radial notches and circumferential notches designed to reduce the losses associated with the eddy currents induced.

8. The coil according to claim 1, in which said partial windings are formed in the manner of a double pancake and in which said at least one cooling sheet is flat and arranged between each partial winding and the next adjacent one, said at least one cooling sheet having a substantially annular shape and having a respective projecting portion which projects laterally from the coil so as to allow the thermal connection thereof to the cryogenic cooling system and in which said support structure comprises a pair of end plates with an annular shape arranged on opposite sides of the coil.

9. The coil according to claim 1, in which each articulated support comprises a hollow strut which is made of material with a high mechanical strength and low thermal conductivity.

10. The coil according to claim 1, in which said cryogenic cooling system comprises at least one cryocooler with two refrigeration stages, the first refrigeration stage of which is connected in a thermally conductive manner to a heat screen and the second refrigeration stage of which is connected in a thermally conductive manner to said at least one cooling sheet.

11. The coil according to claim 1, also comprising electric feedthroughs respectively connected to the terminals of the set of windings, which feedthroughs are arranged so as to project partially outside the vacuum chamber, being envisaged for connection to an external power supplier, in which each feedthrough comprises:
    a first part which is connected directly to the set of windings and which is formed with a superconductor having a high critical temperature; and a second part which is connected to the first part and partially projects from the vacuum chamber and which is made of resistive material and has dimensions such as to minimize both the thermal power generated by the Joule effect and the thermal conduction.

12. The coil according to claims 10, also comprising electric feedthroughs respectively connected to the terminals of the set of windings, which feedthroughs are arranged so as to project partially outside the vacuum chamber, being envisaged for connection to an external power supplier, in which each feedthrough comprises:
    a first part which is connected directly to the set of windings and which is formed with a superconductor having a high critical temperature; and a second part which is connected to the first part and partially projects from the vacuum chamber and which is made of resistive material and has dimensions such as to minimize both the thermal power generated by the Joule effect and the thermal conduction, in which said first part of the feedthrough is connected in a thermally conductive manner to the second refrigeration stage of the cryocooler and in which a zone for connection of said first and second parts is connected in a thermally conductive manner to the first refrigeration stage of the cryocooler.

13. A magnetic resonance imaging apparatus, comprising:
a magnet, comprising a U-shaped yoke which connects together a pair of pole faces which are separated at a distance from each other along a polar axis, said magnet being arranged vertically so that the polar axis is arranged horizontally and above the central part of the yoke, in which the pole faces define between them a receiving zone for a patient, and magnetic flux generating means which can be controlled so as to generate a magnetic flux within the receiving zone,
in which said magnetic flux generating means comprise a pair of coils according to claim 1, which are respectively arranged around said pole faces.

* * * * *